(12) United States Patent
Yamanaka

(10) Patent No.: US 9,653,675 B2
(45) Date of Patent: May 16, 2017

(54) DRIVING APPARATUS, LENS APPARATUS INCLUDING THE SAME, AND IMAGING APPARATUS

(71) Applicant: CANON KABUSHIKI KAISHA, Tokyo (JP)

(72) Inventor: Takumi Yamanaka, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 25 days.

(21) Appl. No.: 14/854,543

(22) Filed: Sep. 15, 2015

(65) Prior Publication Data

US 2016/0103296 A1   Apr. 14, 2016

(30) Foreign Application Priority Data

Oct. 10, 2014 (JP) ................. 2014-208812
Apr. 9, 2015 (JP) ................. 2015-079809

(51) Int. Cl.

| G02B 7/02 | (2006.01) |
|---|---|
| H01L 41/09 | (2006.01) |
| H01L 41/053 | (2006.01) |
| G02B 7/08 | (2006.01) |
| G03B 3/10 | (2006.01) |

(52) U.S. Cl.
CPC ............ H01L 41/09 (2013.01); G02B 7/08 (2013.01); G03B 3/10 (2013.01); H01L 41/0536 (2013.01); G03B 2205/0061 (2013.01)

(58) Field of Classification Search
CPC ...................................... H01L 41/09
USPC ........................................... 359/824
See application file for complete search history.

(56) References Cited

U.S. PATENT DOCUMENTS

| 7,973,822 B2 | 7/2011 | Kawai et al. |
| 2008/0174206 A1* | 7/2008 | Sakamoto ........... H02N 2/004 |
| | | 310/323.09 |
| 2014/0293463 A1 | 10/2014 | Yamanaka et al. |

FOREIGN PATENT DOCUMENTS

JP         2009-011099 A         1/2009

* cited by examiner

*Primary Examiner* — James Jones
(74) *Attorney, Agent, or Firm* — Fitzpatrick, Cella, Harper & Scinto

(57) ABSTRACT

A driving apparatus comprises a movable portion having movable side guide portions; a base portion having fixed side guide portions; a vibrator having a piezoelectric element; a friction member provided at one of the movable portion and the base portion; a pressing portion, provided at the other of the movable member and the base portion, for applying a pressing force to the vibrator; and rolling portions sandwiched between the movable side guide portions and the fixed side guide portions. The movable side guide portions and the fixed side guide portions extend with a predetermined length in a moving direction in which the movable portion is moved with respect to the base portion, and one of movable side guide portions is positioned within spacing in a direction orthogonal to the moving direction of a pair of movable side guide portions of the movable side guide portions.

16 Claims, 7 Drawing Sheets

DRIVING APPARATUS, LENS APPARATUS INCLUDING THE SAME, AND IMAGING APPARATUS

BACKGROUND OF THE INVENTION

Field of the Invention

The present invention relates to a driving apparatus, more specifically, to a linear driving type of vibration wave motor, called hereinafter linear vibration wave motor.

Description of the Related Art

In a conventional linear vibration wave motor, a high frequency voltage is applied to a piezoelectric element to vibrate a vibrator on which a piezoelectric element is fixed. Vibration of vibrator drives a sliding member pressed by the vibrator. Various attempts have been made to provide a compact type of linear vibration wave motors that are capable of maintaining high power output and enhancing driving efficiency.

For example, in a linear vibration wave motor disclosed in Japanese Patent application Laid-open No. 2009-011099, a vibrator having a piezoelectric element is provided with two drivers abutted to a driven member and four rolling members between the driven member and a base member. And the four rolling members are arranged with spacing so as not to enter between the two driving elements in the driving direction of driven member.

However, it is necessary to make longer the arrangement spacing of four rolling members in the driving direction of the driven member, in order to maintain the configuration that the four rolling members do not enter between the two drivers in the driving direction of the driven member, in the linear vibration wave motor disclosed in Japanese Patent application Laid-open No. 2009-011099. As a result, there has been a problem that a full length of unit in the driving direction becomes large.

SUMMARY OF THE INVENTION

An object of the invention is made to solve the above-mentioned problem and to provide a linear vibration wave motor as a compact driving apparatus with no need to enlarge a projected area viewed from the pressing direction of driven member and without reducing a power output, driving efficiency and driving amount.

To solve the above-mentioned problem, the driving apparatus of the invention is configured as mentioned below. A driving apparatus comprises: a movable portion having a plurality of movable side guide portions; a base portion having a plurality of fixed side guiding portions opposed to said plurality of movable side guide portions; a vibrator having a piezoelectric element, the vibrator being provided at either one of said movable portion and said base portion; a friction member provided at the other of said movable portion and said base portion; a pressing portion, provided at said one of said movable member and said base portion, for applying pressing force to said vibrator to bring the vibrator into pressed contact with said friction member; and a plurality of rolling portions sandwiched between said plurality of movable side guide portions and said plurality of fixed side guide portions, wherein said plurality of movable side guide portions and said plurality of fixed side guide portions extend with a predetermined length in a moving direction in which said movable portion is moved with respect to said base portion through said plurality of rolling portions by vibration excited by said piezoelectric element, and wherein, within spacing in a direction orthogonal to said moving direction of a pair of movable side guide portions of said plurality of movable side guide portions, a pressing center of said pressing portion and another movable side guide portion of said plurality of movable side guide portions are positioned.

Further, to solve the above-mentioned problem, the lens apparatus of the invention is configured as follows. A lens apparatus comprises:

a driving apparatus, the driving apparatus comprising:
  a movable portion having a plurality of movable side guide portions;
  a base portion having a plurality of fixed side guiding portions opposed to said plurality of movable side guide portions;
  a vibrator having a piezoelectric element, the vibrator being provided at either one of said movable portion and said base portion;
  a friction member provided at the other of said movable portion and said base portion;
  a pressing portion, provided at said one of said movable member and said base portion, for applying pressing force to said vibrator to bring the vibrator into pressed contact with said friction member; and
  a plurality of rolling portions sandwiched between said plurality of movable side guide portions and said plurality of fixed side guide portions,
  wherein said plurality of movable side guide portions and said plurality of fixed side guide portions extend with a predetermined length in a moving direction in which said movable portion is moved with respect to said base portion through said plurality of rolling portions by vibration excited by said piezoelectric element,
  wherein, within spacing in a direction orthogonal to said moving direction of a pair of movable side guide portions of said plurality of movable side guide portions, a pressing center of said pressing portion and another movable side guide portion of said plurality of movable side guide portions are positioned,
  wherein one movable side guide portion of said pair of movable side guide portions has a V-shaped groove to sandwich said rolling portion with said fixed side guide portion having a V-shaped groove,
  wherein another movable side guide portion of said pair of movable side guide portions has a V-shaped groove or a plane groove,
  wherein if said another movable side guide portion of said pair of movable side guide portions has said V-shaped groove, said another movable side guide portion sandwiches said rolling portion with said fixed side guide portion having a plane groove,
  wherein if said another movable side guide portion of said pair of movable side guide portions has said plane groove, said another movable side guide portion sandwiches said rolling portion with said fixed side guide portion having a V-shaped groove,
  wherein said movable portion has a transmission portion for transmitting drive force to a drive object member,
  wherein said transmission portion is placed at a side where said one of movable side guide portion of said pair of movable side guide portions with respect to said moving direction;

a drive force transmitting portion to be engaged with said transmission portion;

a lens holding frame holding a lens, the lens holding frame being connected with said movable portion through said drive force transmitting portion; and a guide bar holding said lens holding frame so that said lens holding frame is movable linearly.

Furthermore, to solve the above-mentioned problem, the imaging apparatus of the invention is configured as follows. An imaging apparatus comprises:

a lens apparatus; and
a mount portion on which said lens apparatus is removably mounted;
said lens apparatus comprises:
a driving apparatus, the driving apparatus comprising:
a movable portion having a plurality of movable side guide portions;
a base portion having a plurality of fixed side guiding portions opposed to said plurality of movable side guide portions;
a vibrator having a piezoelectric element, the vibrator being provided at either one of said movable portion and said base portion;
a friction member provided at the other of said movable portion and said base portion;
a pressing portion, provided at said one of said movable member and said base portion, for applying pressing force to said vibrator to bring the vibrator into pressed contact with said friction member; and
a plurality of rolling portions sandwiched between said plurality of movable side guide portions and said plurality of fixed side guide portions,
wherein said plurality of movable side guide portions and said plurality of fixed side guide portions extend with a predetermined length in a moving direction in which said movable portion is moved with respect to said base portion through said plurality of rolling portions by vibration excited by said piezoelectric element,
wherein, within spacing in a direction orthogonal to said moving direction of a pair of movable side guide portions of said plurality of movable side guide portions, a pressing center of said pressing portion and another movable side guide portion of said plurality of movable side guide portions are positioned,
wherein one movable side guide portion of said pair of movable side guide portions has a V-shaped groove to sandwich said rolling portion with said fixed side guide portion having a V-shaped groove,
wherein another movable side guide portion of said pair of movable side guide portions has a V-shaped groove or a plane groove,
wherein if said another movable side guide portion of said pair of movable side guide portions has said V-shaped groove, said another movable side guide portion sandwiches said rolling portion with said fixed side guide portion having a plane groove,
wherein if said another movable side guide portion of said pair of movable side guide portions has said plane groove, said another movable side guide portion sandwiches said rolling portion with said fixed side guide portion having a V-shaped groove,
wherein said movable portion has a transmission portion for transmitting drive force to a drive object member, and
wherein said transmission portion is placed at a side where said one of movable side guide portion of said pair of movable side guide portions with respect to said moving direction;
a drive force transmitting portion to be engaged with said transmission portion;

a lens holding frame holding a lens, the lens holding frame being connected with said movable portion through said drive force transmitting portion; and
a guide bar holding said lens holding frame so that said lens holding frame is movable linearly.

According to the invention, a linear vibration wave motor as a compact driving apparatus without reducing a power output, driving efficiency and driving amount and with no need to enlarge the projected area viewed from the pressing direction of driven member can be obtained.

Further features of the present invention will become apparent from the following description of exemplary embodiments with reference to the attached drawings.

BRIEF DESCRIPTION OF THE DRAWINGS

FIGS. 1A and 1B illustrate a linear vibration wave motor of embodiment 1 according to the invention, of which FIG. 1A is a plan view, and FIG. 1B is a cross sectional view taken along a line 1B-1B in FIG. 1A.

FIGS. 3A, 3B and 3C are plan views illustrating a linear vibration wave motor of embodiment 1 according to the invention, of which FIG. 3A illustrates a movable member positioned at a middle position, FIG. 3B illustrates a movable member positioned at a positive side movable end, and FIG. 3C illustrates a movable member positioned at a negative side movable end.

FIGS. 6A and 6B illustrate a linear vibration wave motor of embodiment 4 according to the invention, of which FIG. 6A is a plan view and FIG. 6B is a cross sectional view taken along a line 6B-6B in FIG. 6A.

DESCRIPTION OF THE EMBODIMENTS

Preferred embodiments of the present invention will now be described in detail in accordance with the accompanying drawings. In the following, an exemplary linear vibration wave motor that is unitized as an actuator for driving a lens barrel and the like of digital camera will be explained. However, the use of the invention is not limited thereto.

To facilitate understanding each embodiment, the following explanation in association with the drawings will be made while defining a relative moving direction between a vibrator and a friction member as an "X-axis", a direction in which the vibrator is pressed against the friction member by a pressing spring as a "Z-axis" and a direction orthogonal to the X-axis and Z-axis as a "Y-axis".

Embodiment 1

Figure 1A:
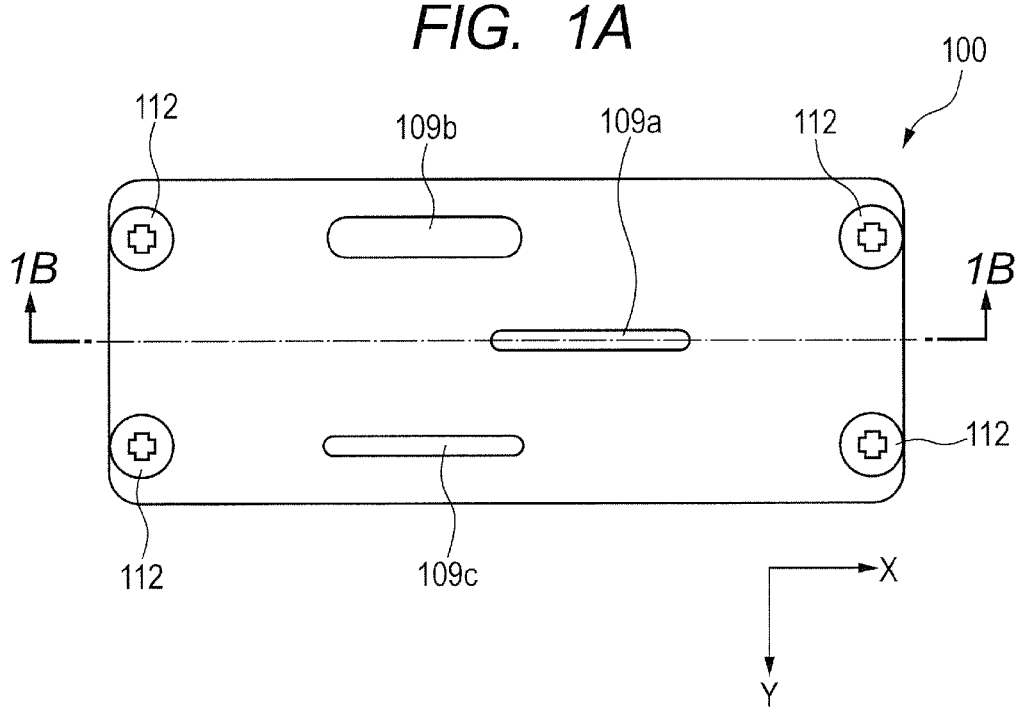
Figure 1B:
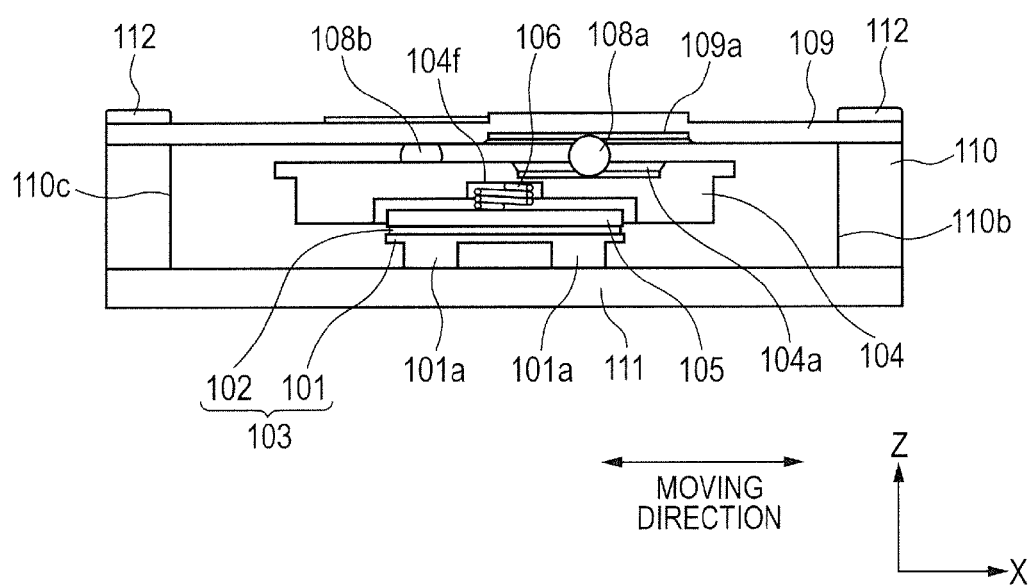

FIGS. 1A and 1B illustrate a linear vibration wave motor of embodiment 1 according to the invention, of which FIG.

Figure 2:
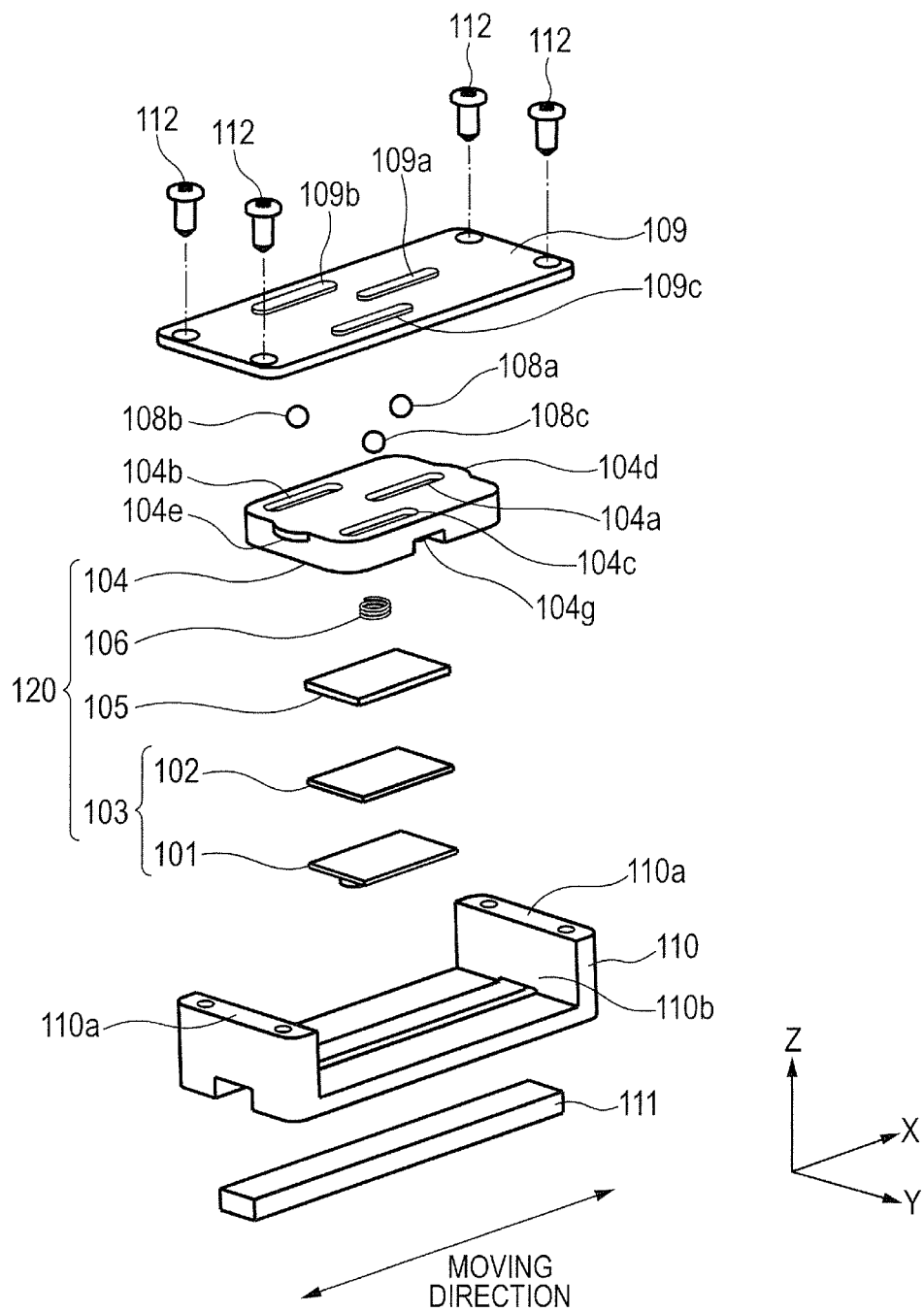
FIG. 2 is an exploded perspective view illustrating a linear vibration wave motor of embodiment 1 according to the invention.

1A is a plan view, and FIG. 1B is a cross sectional view taken along a line 1B-1B in FIG. 1A. FIG. 2 is an exploded perspective view illustrating a linear vibration wave motor of embodiment 1 according to the invention.

A linear vibration wave motor 100 of embodiment 1 of the invention has a longitudinal axis in an X-axis direction and is configured by each of the members to be described later. A piezoelectric element 102 is fixed on a vibrating plate 101 by a glue agent or the like, and a voltage is applied to the piezoelectric element 102 to excite vibration (vibration wave). It is noted that configuration of adhesion between the vibrating plate 101 and the piezoelectric element 102 is not limited as long as the adhesion is obtained. The vibrating plate 101 is further provided with a contact portion 101a, and the contact portion 101a is in pressed contact with a friction member 111 to be described later in a contact state under pressure. A vibrator 103 is constituted by the vibrating plate 101 and the piezoelectric element 102. The piezoelectric element 102 generates vibration in a state where the vibrating plate 101 and the piezoelectric element 102 are glued, so that a resonance phenomenon on the vibrator 103 occurs. As a result, the contact portion 101a of the vibrating plate 101 causes an elliptical motion. A rotational direction and a ratio of the major axis to the minor axis of the ellipse of elliptical motion are properly changed by changing a frequency and a phase of voltage applied to the piezoelectric element 102 to obtain desired motion.

A pressing mechanism retaining member 104 is provided with a retaining hole 104a for receiving a spring 106 of an XZ plane. One end of spring 106 is in contact with an elastic member 105. The other end of spring 106 is in contact with the pressing mechanism retaining member 104. The spring 106 is sandwiched by the pressing mechanism retaining member 104 and the elastic member 105 in the retaining hole 104a. Accordingly, the spring 106 becomes freely expanded and contracted to provide pressing force in the Z-axis direction. In the embodiment, the pressing mechanism retaining member 104, the elastic member 105 and the spring 106 constitute a pressing portion and centers of gravity of each of the components are connected with each other by a straight line parallel to the Z-axis.

The elastic member 105 is arranged between the piezoelectric element 102 and the spring 106. The elastic member 105 prevents the spring 106 and the piezoelectric element 102 from being in direct contact with each other to prevent the piezoelectric element 102 from being damaged.

The pressing mechanism retaining member 104 is provided with three movable side guide portions 104a, 104b and 104c that are V-shaped grooves each having a V-shaped cross section. The plurality of movable side guide portions 104a, 104b and 104c that are the V-shaped grooves have a predetermined length in the X-axis direction to receive spherical rolling members 108a, 108b and 108c as rolling portions, respectively. In the embodiment, the above-described pressing portion and the movable side guide portion 104a are arranged in spacing in the Y-axis direction between a pair of other movable side guide portions 104b and 104c of the pressing mechanism retaining member 104.

On the other hand, a cover plate 109 as a fixed portion is also provided with a plurality of fixed side guide portions 109a, 109b and 109c, each of which has a predetermined length in the X-axis direction, and of which the fixed side guide portions 109a and 109c that are V-shaped grooves have a V-shaped cross-section and of which the fixed guide portion 109b has a plane groove. It is configured that the fixed side guide portions 109a and 109c of V-shaped grooves and the fixed side guide portion 109b of plane groove are opposed to the movable side guide portions 104a, 104b and 104c of V-shaped grooves, respectively. And the plurality of rolling members 108a, 108b and 108c are respectively received by the fixed side guide portions 109a and 109c of V-shaped grooves and the fixed side guide portion 109b of plane groove so as to be sandwiched between the movable guide portions and the fixed side guide portions. Thus, the pressing mechanism retaining member 104 is movable relative to the cover plate 109 in the X-axis direction without back-lash. The movable side guide portions 104a, 104b and 104c and the fixed side guide portions 109a and 109c are not limited to the V-shaped grooves having the V-shaped cross section. The movable side guide portions 104a, 104b and 104c and the fixed side guide portions 109a and 109c may be formed in other shapes as long as the rolling members are sandwiched so as to be guided to move linearly.

In the embodiment, the fixed side guide portions 109a and 109c of cover plate 109 are configured as V-shaped grooves and the fixed side guide portion 109b is configured as a plain groove. Further, the movable side guide portions 104a, 104b and 104c of the pressing mechanism retaining member 104 are configured as V-shaped grooves. However, the embodiment is not limited thereto and the fixed side guide portions 109a, 109b and 109c of the cover plate 109 and the movable side guide portions 104a and 104c of pressing mechanism retaining member 104 may be configured as V-shaped grooves and the movable side guide portion 104b may be configured as a plane groove.

Further, a transmission portion 104g to be engaged with a drive force transmitting portion 130 to be described later is placed near the V-shaped groove of the fixed side guide portion 109c in the embodiment. Thus, when external force is applied from the drive force transmitting portion 130, a magnitude of moment caused on a driven member can be lowered since the fixed side guide portion 109c of V-shaped groove is disposed near the transmission portion 104g.

The linear vibration wave motor 100 is furthermore provided with a bottom plate 110. The bottom plate 110 is formed in a concave shape on an XY plane, and is provided with side walls 110b and 110c at both sides in the X-axis direction and with fixed portions 110a formed by upper surfaces of the side walls in the Z-axis direction. The fixed portions 110a are provided with screw holes, which are respectively opposed to screw holes of the cover plate 109. The core plate 109 and the bottom plate 110 are fixed on each other by screws 112. However, the fixing configuration is not limited as long as the fixation is obtained. Additionally, the friction member 111 is fixed on the bottom surface side of bottom plate 110 by a not illustrated screw or the like from the bottom side in the Z-axis. The friction member 111 is in contact with the contact portion 101a of vibrating plate 101, and elliptic motion occurring at the vibrator 103 by friction between the friction member 111 and the contact portion 101a acts as driving force of the movable portion 120. The movable member 20 is capable of moving back and forth in the X-axis direction, that is the moving direction, by the driving force. The fixing configuration is not limited as long as the bottom plate 110 and the friction plate 111 are fixed to each other. In the embodiment, the vibrator 103, the pressing mechanism retaining member 104, the elastic member 105, and the spring 106 constitute a movable portion 120. The cover plate 109, the screw 112, the bottom plate 110, and the friction member 111 constitute a base portion.

Next, pressing force generated by the pressing portion will be described. The pressing force of spring 106 acts as urging force for pressing the vibrator 103 against the friction plate 111 through an elastic member 105. And, the contact portion 101a of vibrating plate 101 is in pressed contact with the friction plate 111. On the other hand, a counterforce of the pressing force from the friction plate 111 is received by the cover plate 109 through the movable portion 120 and the rolling members 108a, 108b and 108c. Under such a pressed contact state, when a voltage is applied to the piezoelectric element 102, elliptic motion due to resonance occurring on the vibrator 103 in each of the X-axis direction and the Y-axis direction is transmitted to the friction plate 111 efficiently. As a result, the movable portion 120 is movable back and forth in the X-axis direction.

Each component described above is installed to be unitized as a linear oscillator wave motor.

Figure 3A:
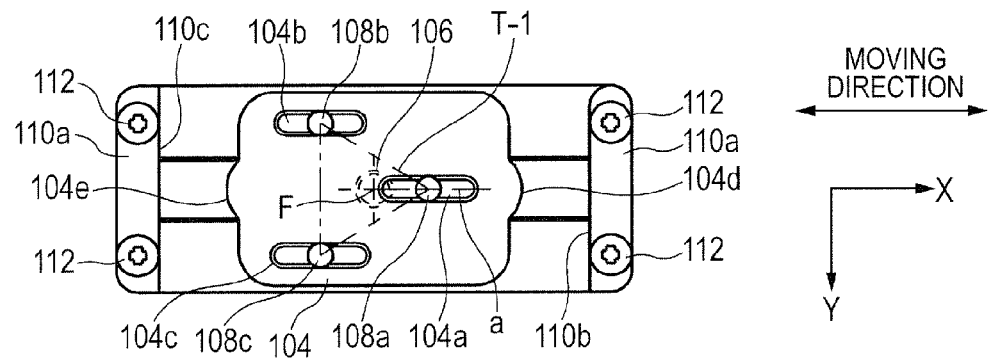
Figure 3B:
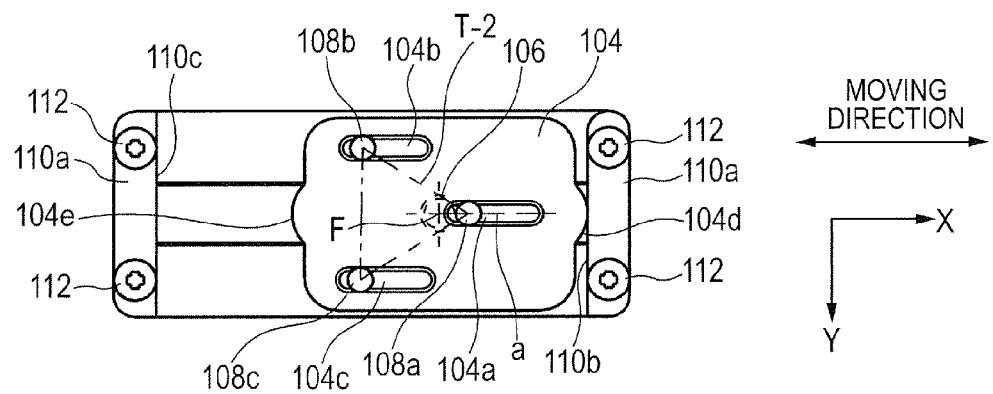
Figure 3C:
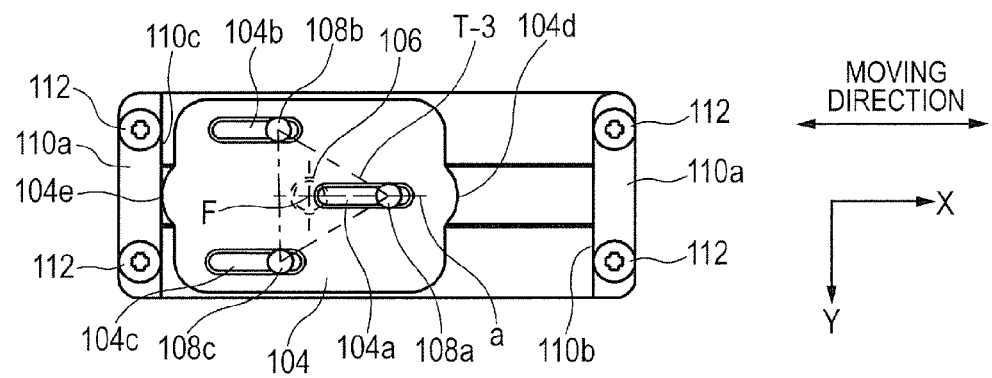

Next, a configuration of relative movement of movable portion 120 to the base portion will be described with reference to FIGS. 3A, 3B and 3C. FIGS. 3A, 3B and 3C are plan views, viewed from the Z-axis direction, of the linear vibration wave motor 100 illustrated in FIG. 1A. In order to facilitate explanation, the cover plate 109 is not illustrated. In the following, a pressing center F is a central axis of spring 106, and a center of gravity of each member is connected with each other by a straight line parallel with the Z-axis. Accordingly, the pressing center F coincides with a power point in a case where pressing force by the spring 106 is focused on one point.

In the drawings, the pressing mechanism retaining member 104 of the movable portion 120 of the linear vibration wave motor has a width in the Y-axis direction substantially equal to the width of the bottom plate 110 in the Y-axis direction of the base portion. Further, in the projection to the XY plane, the pressing mechanism retaining member 104 is shaped substantially as a rectangle, and is preferably configured such that a point at which diagonals thereof intersect coincides with the pressing center F. Further, the pressing mechanism retaining member 104 is provided with the movable side guide portion 104a that has a longitudinal axis a that is parallel with the X-axis and intersects the pressing center F on the axis a. Namely, the movable side guide portion 104a is extended parallel with the X-axis with a predetermined length in the pressing mechanism retaining member 104. Preferably, the movable side guide portion 104a is provided in such a manner that the pressing direction of the pressing portion is orthogonal to an axial line a in a longitudinal direction of the movable side guide portion 104a. On the other hand, the movable side guide portions 104b and 104c are provided respectively at opposed sides across the pressing center F in the Y-axis direction and are provided parallel with the X-axis with a predetermined length. In the embodiment, the movable side guide portions 104b and 104c are spaced equally from the movable side guide portion 104a in the Y-axis direction.

In FIG. 3A, the movable portion 120 is placed at a middle position in the movable range with respect to the basic portion. In the state, the rolling members 108a, 108b and 108c are respectively positioned at the middle positions in the X-axis direction of the movable side guide portions 104a, 104b and 104c. In the projection to the XY plane, the pressing center F is positioned within a triangle T-1 formed by connecting the centers of rolling members 108a, 108b and 108c. Thus, the three rolling members 108a, 108b and 108c stably support counterforce by pressure at the middle position of the movable range.

In FIG. 3B, the movable member 120 is placed at a positive side movable end that is a movable end at a positive side in the X-axis direction with respect to the middle position of FIG. 3A. The pressing mechanism retaining member 104 is provided with a stop projection portion 104d to be abutted first to a side wall 110b at the positive side in the X-axis direction. Accordingly, when the movable portion 120 is driven in the positive direction of the X-axis from the middle position, the stop projection portion 104d acting as a movable end and the side wall 110b acting as a movable end restriction portion are abutted to each other to define the movable end portion of the movable portion 120. At the positive side movable end, the pressing center F is positioned within a triangle T-2 formed by connecting the centers of rolling members 108a, 108b and 108c in the projection to the XY plane. Accordingly, the three rolling members 108a, 108b and 108c stably support counterforce by pressure at the positive side movable end, too.

Further, in FIG. 3C, the movable member 120 is placed at a negative side movable end that is a movable end at a negative side in the X-axis direction with respect to the middle position of FIG. 3A. The pressing mechanism retaining member 104 is provided with a stop projection portion 104e to be abutted first to a side wall 110c at a negative side in the X-axis direction. Accordingly, when the movable portion 120 is moved in the negative direction of the X-axis from the middle position, the stop projection portion 104e acting as a movable end and a side wall 110c acting as a movable end restriction portion are abutted to each other to define the movable end portion of the movable portion 120. In this state, similarly to FIG. 3B, the pressing center F is positioned within a triangle T-3 formed by connecting the centers of rolling members 108a, 108b and 108c in the projection to the XY plane at the negative side movable end. Thus, the three rolling members 108a, 108b and 108c stably support counterforce by pressure at the negative side movable end, too.

As described above, the pressing center F (pressing point of the pressing portion) is positioned in spacing in a direction orthogonal to the moving direction of the pair of movable side guide portions 104b and 104c, and another movable side guide portion 104a is also positioned in the spacing. Thus, even if the positions of movable side guide portions 104a, 104b and 104c are brought close to the pressing center F, such arrangement that the pressing center F is always present in the position within a triangle formed by connecting optional single points of each movable side guide position 104a, 104b and 104c can be readily set. Accordingly, in the movable range of the movable portion 120, the pressing center F is positioned within the triangles T-1, T-2 and T-3 formed by connecting the centers of three rolling members 108a, 108b and 108c, thereby to achieve stable support. Further, the movable side guide portion 104a is preferably positioned on an axial line a in the longitudinal direction of the movable side guide portion 104a and at a position where the pressing center F (pressing portion of pressing portion) crosses the axial line a; namely, the movable side guide portion 104a is positioned in such a manner that the axial line a in the longitudinal direction of the movable side guide portion 104a is orthogonal to the pressing direction of the pressing portion.

As described above, without lowering a power output, driving efficiency and driving amount, a compact linear vibration wave motor with no need to enlarge a projected area viewed from the pressing direction of the driven member can be obtained according to the embodiment.

Embodiment 2

Figure 4:
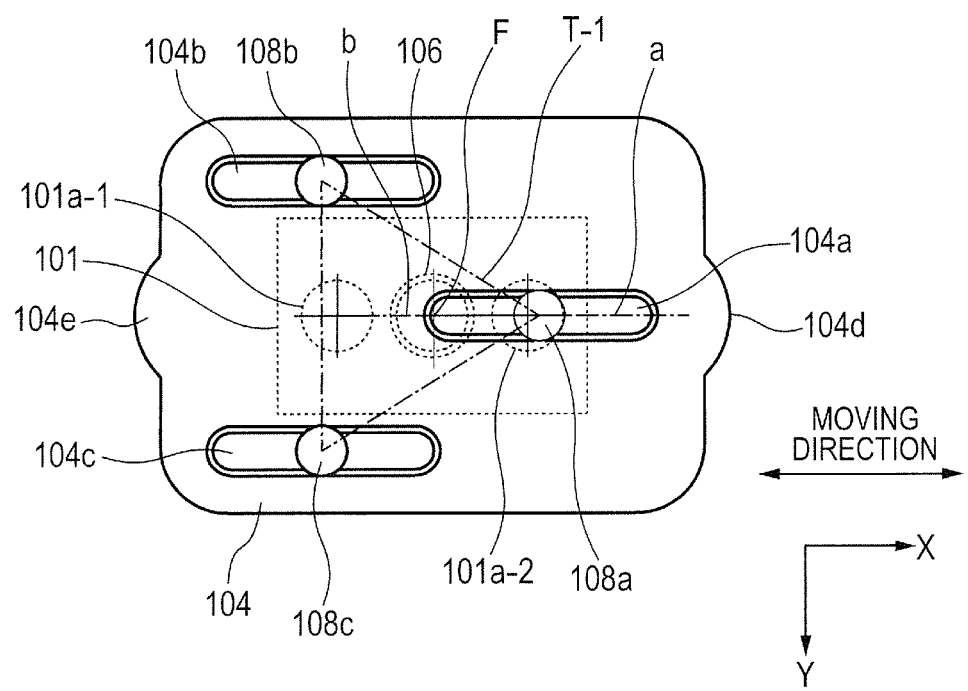
FIG. 4 is a plan view illustrating a linear vibration wave motor of embodiment 2 according to the invention.

FIG. 4 is a plan view, viewed from the Z-axis direction, illustrating a linear vibration wave motor as a driving apparatus of embodiment 2 according to the invention. It is noted that a part of parts is not illustrated to facilitate the explanation.

In the figure, common numerals are assigned to members having common functions to those of embodiment 1. Further, explanation as to common configurations and functions to those of embodiment 1 is omitted.

In the embodiment, a vibrating plate 101 is provided with two contact portions 101a-1 and 101a-2, which are in pressed contact with a not illustrated friction member by a pressing portion including a spring 106. A line b connecting the centers of each of two contact portions 101a-1 and 101a-2 is parallel to an X-axis.

A pressing mechanism retaining member 104 is provided with three movable side guide portions 104a, 104b and 104c that are V-shaped grooves each having a V-shaped cross section. The movable side guide portions 104a, 104b and 104c that are the V-shaped grooves have a predetermined length in the X-axis direction to receive spherical rolling members 108a, 108b and 108c as rolling portions, respectively. In the embodiment, the above-described two contact portions 101a-1 and 101a-2 and the movable side guide portion 104a are arranged in spacing in a Y-axis direction between a pair of other movable side guide portions 104b and 104c.

According to the embodiment, the two contact portions 101a-1 and 101a-2 of vibrating plate 101 that is a drive generating source are arranged within spacing between the pair of movable side guide portions 104b and 104c so that the movable portion 120 can advance stably in a moving direction.

Furthermore, an alignment may be made such that an axial line a in the longitudinal direction of the movable side guide portion 104a and the line b connecting centers of each of two contact portions 101a-1 and 101a-2 are arranged on a same line. Thus, the movable side guide portion 104a is arranged on the axis of the drive generating source portion so that the movable portion 120 can advance stably in the moving direction.

Embodiment 3

Figure 5:
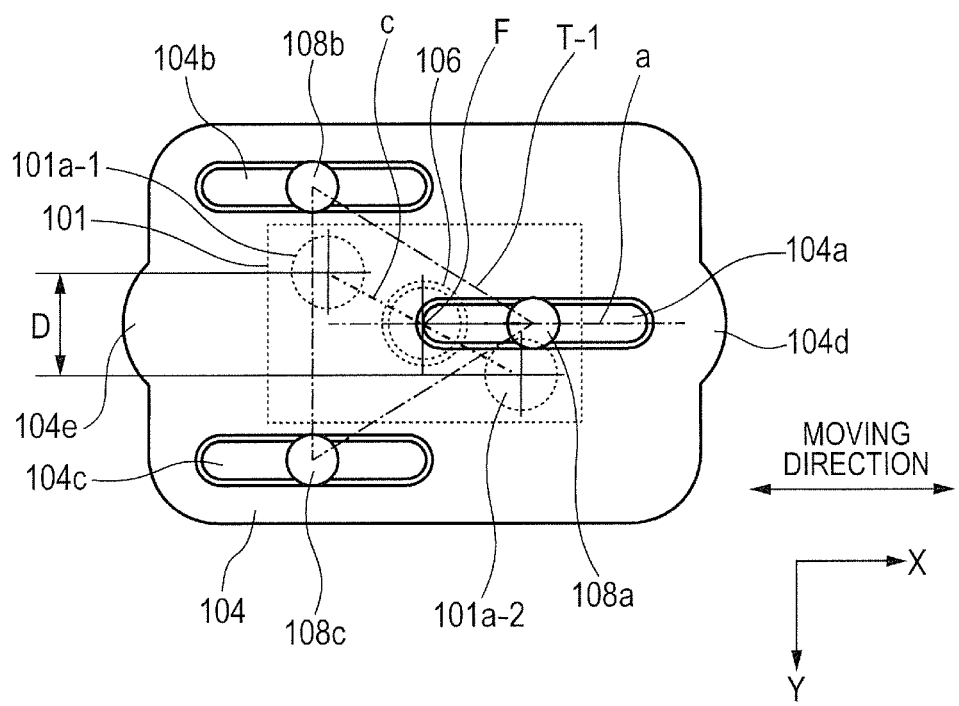
FIG. 5 is a plan view illustrating a linear vibration wave motor of embodiment 3 according to the invention.

FIG. 5 is a plan view, viewed from the Z-axis direction, illustrating a linear vibration wave motor of embodiment 3 according to the invention. It is noted that a part of parts is not illustrated to facilitate the explanation.

In the figure, common numerals are assigned to members having common functions to those of embodiment 1. Further, explanation as to common configurations and functions to those of embodiment 1 is omitted.

In the embodiment, the vibrating plate 101 is provided with two contact portions 101a-1 and 101a-2, which are in pressed contact with a not illustrated friction member by a pressing portion including a spring 106. A line c connecting the centers of each of two contact portions 101a-1 and 101a-2 is arranged at a predetermined angle with respect to an X-axis.

A pressing mechanism retaining member 104 is provided with three movable side guide portions 104a, 104b and 104c that are V-shaped grooves each having a V-shaped cross section. The movable side guide portions 104a, 104b and 104c that are the V-shaped grooves have a predetermined length in an X-axis direction to receive spherical rolling members 108a, 108b and 108c as rolling portions, respectively. In the embodiment, the two contact portions 101a-1 and 101a-2 of the above-described vibrating plate and the movable side guide portion 104a are arranged in spacing in the Y-axis direction between a pair of other movable side guide portions 104b and 104c.

According to the embodiment, the two contact portions 101a-1 and 101a-2 of vibrating plate 101 that is a drive generating source are arranged within the spacing between a pair of movable side guide portions 104b and 104c so that the movable portion 120 can advance stably in the moving direction.

Furthermore, an axial line a in the longitudinal direction of the movable side guide portion 104a may be arranged between the centers (in a dimension D portion) in the Y-axis direction of each of two contact portions 101a-1 and 101a-2 of vibrating plate 101. Thus, the movable side guide portion is arranged between the two drive generating source portions of vibrating plate in the Y-axis direction so that the movable portion 120 can move back and forth in the moving direction stably.

Embodiment 4

Figure 6A:
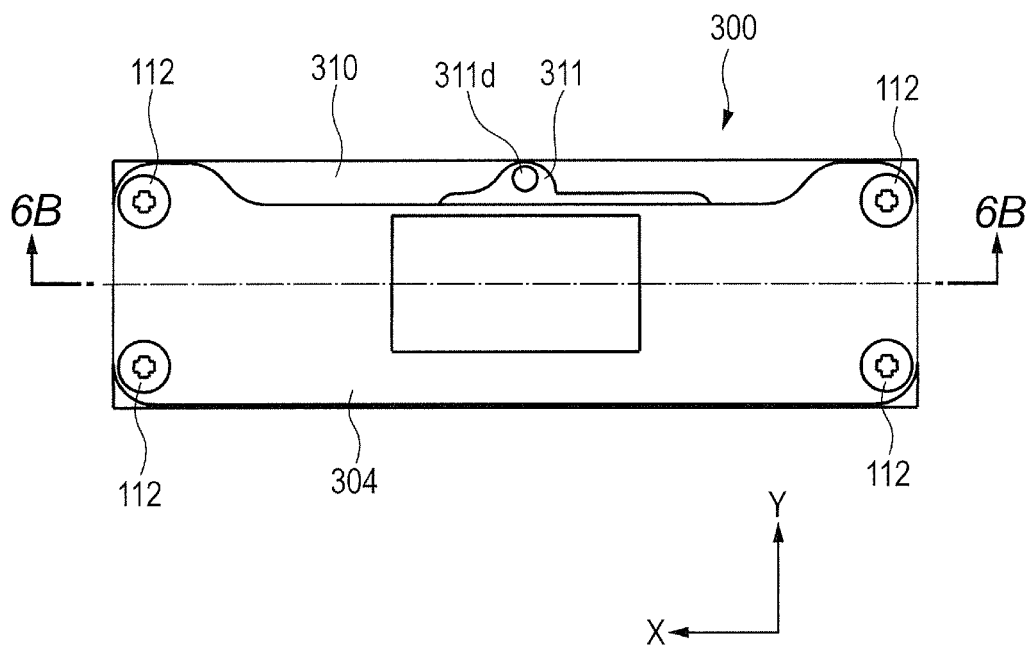
Figure 6B:
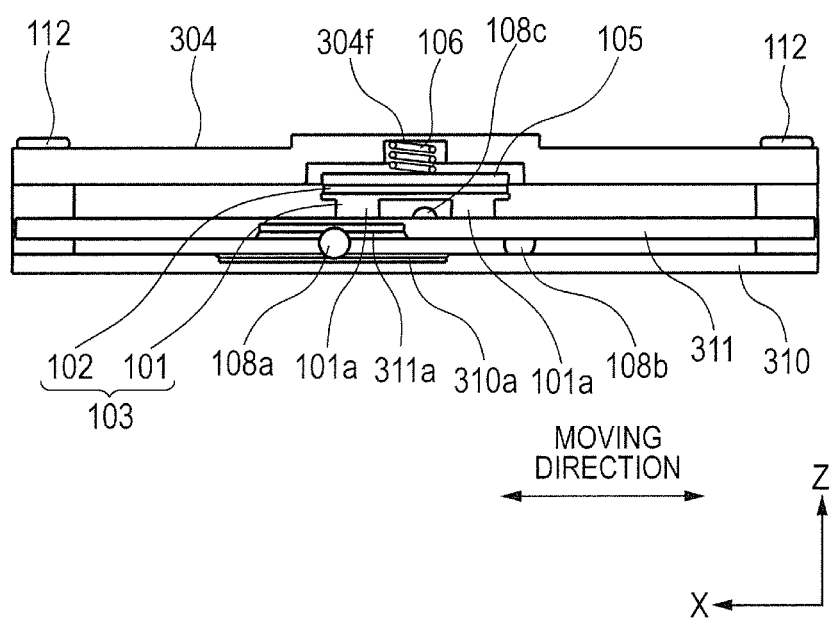

FIGS. 6A and 6B illustrate a linear vibration wave motor of embodiment 4 according to the invention, of which FIG. 6A is a plan view viewed from a Z-axis direction and FIG. 6B is a cross sectional view taken along a line 6B-6B in FIG. 6A.

Figure 7:
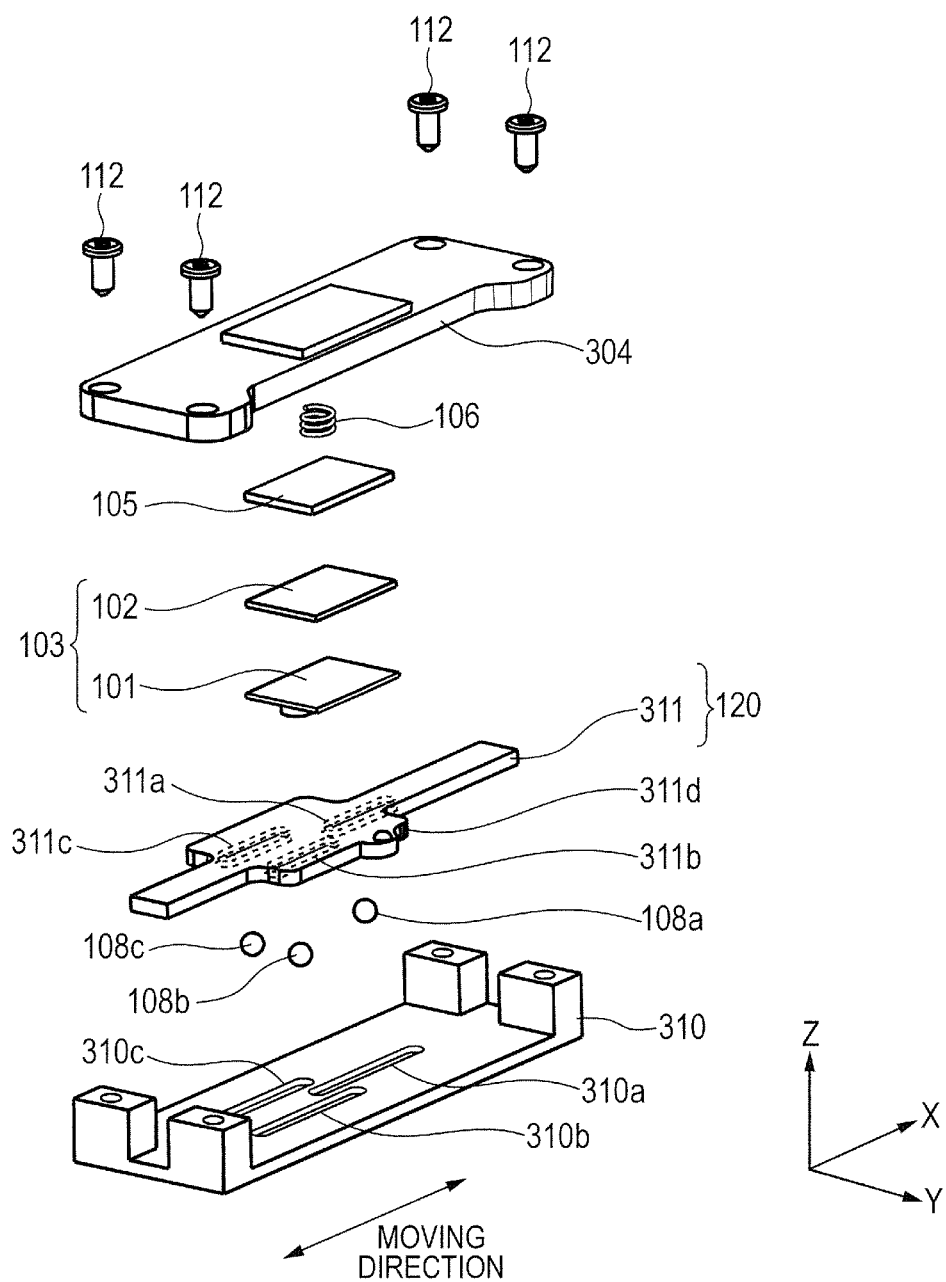
FIG. 7 is an exploded perspective view illustrating a linear vibration wave motor of embodiment 4 according to the invention.

Further, FIG. 7 is an exploded perspective view illustrating a linear vibration wave motor illustrated in FIGS. 6A and 6B.

First, the configuration of linear vibration wave motor 300 of the embodiment will be explained with reference to FIGS. 6A and 6B, and FIG. 7. In the figure, common numerals are assigned to members having common functions to those of embodiment 1. Further, explanation as to common configurations and functions to those of embodiment 1 is omitted.

A linear vibration wave motor 300 of the embodiment has a longitudinal axis in an X-axis direction and is configured by each of the members to be described later. A piezoelectric element 102 is fixed on a vibrating plate 101 by a glue agent or the like. Further, the vibrating plate 101 is provided with contact portions 101a, and the contact portions 101a are, in a pressed contact state, contacted under pressure with a friction portion 311 to be described later. The vibrator 103 is constituted by the vibrating plate 101 and a piezoelectric element 102.

A pressing mechanism retaining member 304 is provided with a retaining hole 304f for receiving a spring 106, the retaining hole 304f having a convex shape in the Z-axis direction of an XZ cross section. One end of spring 106 is in contact with an elastic member 105. The other end of spring 106 is in contact with the pressing mechanism retaining member 304. The spring 106 is sandwiched by the pressing mechanism retaining member 304 and the elastic member 105 in the retaining hole 304a. Thus, the spring 106 becomes freely expanded and contracted to provide pressing force in the Z-axis direction. In the embodiment, the pressing mechanism retaining member 304, the elastic member 105 and spring 106 constitute a pressing portion, and centers of gravity of each of components are connected with each other by a straight line parallel to the Z-axis.

The elastic member 105 is arranged between the piezoelectric element 102 and the spring 106. The elastic member 105 prevents the pressing portion and the piezoelectric element 102 from being in direct contact with each other to prevent the piezoelectric element 102 from being damaged.

The friction member 311 is provided with three movable side guide portions 311a, 311b and 311c that are V-shaped grooves each having a V-shaped cross section, and the plurality of movable side guide portions 311a, 311b and 311c that are the V-shaped grooves have a predetermined length in the X-axis direction. In the embodiment, the above-described pressing portion and the movable side guide portion 311a are arranged in spacing in the Y-axis direction between a pair of other movable side guide portions 311b and 311c of the pressing mechanism retaining member 104. The friction member 311 is provided with a transmission portion 311d to be engaged with a drive force transmitting portion 130 to be described later.

On the other hand, the bottom plate 310 that is a fixed member is also provided with fixed side guide portions 310a and 310b that are V-shaped grooves each having a V-shaped cross section and have a predetermined length in the X-axis direction, and with a fixed side guide portion 310c that is a plane groove. A plurality of spherical rolling members 108a, 108b and 108c as rolling portions are respectively received by the fixed side guide portions 310a and 310b of V-shaped grooves and the fixed side guide portion 310c of plane groove so as to be rotatably sandwiched between the movable guide portions and the fixed side guide portions. The movable side guide portions 311a, 311b and 311c and the fixed side guide portions 310a and 310b are not limited to the V-shaped grooves having the V-shaped cross sections, and they may be formed in other shapes as long as the rolling members are rotatably sandwiched.

In the embodiment, it is preferable that, to guide the friction member 311 straightforwardly in the moving direction effectively, the fixed side guide portions 310a and 310b of V-shaped grooves sandwiching the rolling members 108a and 108b are arranged in such a manner that spacing therebetween is enlarged further in the moving direction. By enlarging the spacing between the fixed side guide portions 310a and 310b in the moving direction of the rolling members 108a and 108b, spacing between the rolling members 108a and 108b can be enlarged further in the moving direction of the rolling members 108a and 108b. As a result, rolling of driven member (friction member 311 in the embodiment) in the moving direction (X-axis direction) can be suppressed.

Further, a transmission portion 311d to be engaged with a drive force transmitting portion 130 to be described later is placed near the fixed side guide portion 109c of the V-shaped groove in the embodiment. Thus, when external force is applied from the drive force transmitting portion 130, a magnitude of moment caused on the driven member can be lowered since the fixed side guide portion 310b of V-shaped groove is positioned near the transmission portion 311d.

In the embodiment, the fixed side guide portions 310a and 310b of bottom plate 310 that is a fixed plate are configured as V-shaped grooves, and the fixed side guide portion 310c is configured as a plain groove. Further, the movable side guide portions 311a, 311b and 311c of the friction plate 311 are configured as V-shaped grooves. However, the embodiment is not limited thereto and the fixed side guide portions 310a, 310b and 310c of the bottom plate 310 and the movable side guide portions 311a and 311c of friction member 311 may be configured as V-shaped grooves and the movable side guide portion 311c of the friction member 311 may be configured as a plane groove.

The friction member 311 is in contact with the contact portions 101a of vibrating plate 101, and elliptic motion occurring on the vibrator 103 by friction between the friction member 311 and the contact portions 101a acts as driving force of the movable portion 120. The movable portion 120 is movable back and forth in the X-axis direction by the driving force. In the embodiment, the vibrator 103, the elastic member 105, the pressing mechanism retaining member 304, the spring 106 and the bottom plate 310 constitute a base portion, and the friction member 311 constitutes a movable portion 120.

Next, pressing force generated by the pressing portion will be described. The pressing force of spring 106 acts as urging force for pressing the vibrator 103 against the friction plate 311 through an elastic member 105. And, the contact portions 101a of the vibrating plate 101 are in pressed contact with the friction plate 311. The pressing force on the friction member 311 is received by the bottom plate 109 through the rolling members 108a, 108b and 108c. Under such a pressed contact state, when a voltage is applied to the piezoelectric element 102, resonance occurs on the vibrator 103 in each of the X-axis direction and the Y-axis direction so as to cause elliptic motion of a tip of the contact portion 101a. As a result, the movable portion 120 is movable back and forth in the X-axis direction.

Figure 8:
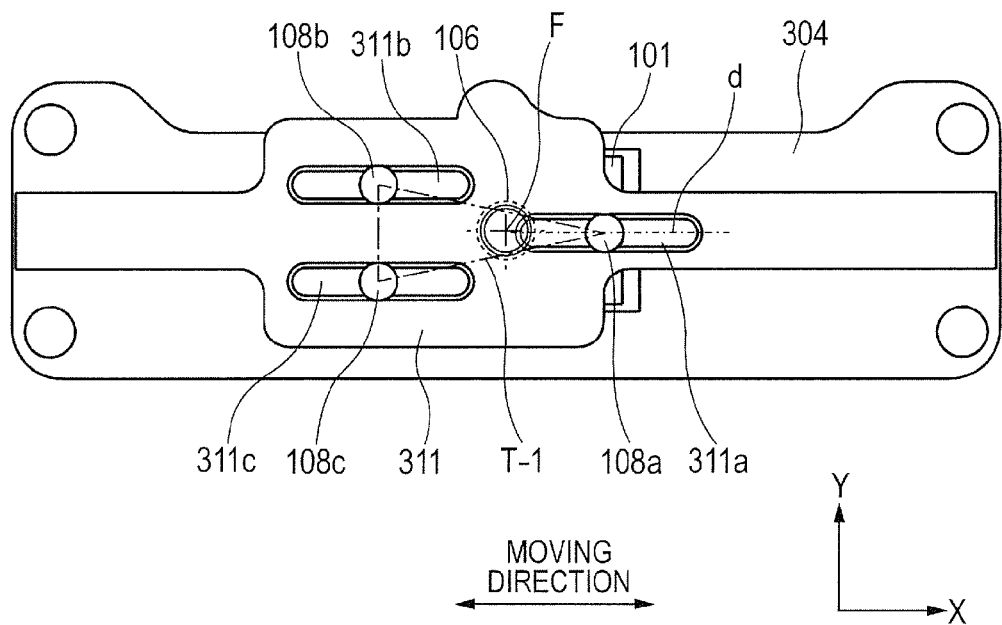
FIG. 8 is a rear view illustrating a linear vibration wave motor of embodiment 4 according to the invention.

FIG. 8 is a rear view illustrating the linear vibration wave motor 300 of embodiment 4 of the invention. It is noted that a part of parts is not illustrated to facilitate the explanation.

In the following, a pressing center F is a central axis of spring 106, and centers of gravity of each member is connected with each other by a straight line parallel with the Z-axis. Accordingly, the pressing center F coincides with a power point in a case where pressing force by the spring 106 is focused on one point.

As described above, the pressing center F (pressing point of the pressing portion) is positioned in spacing in the Y-axis direction between a pair of movable side guide portions 311b and 311c, and another movable side guide portion 311a is also positioned in the spacing. Thus, even if the positions of movable side guide portions 311a, 311b and 311c are brought close to the pressing center F, such arrangement that the pressing center F is always present within a triangle connecting optional single points of each of movable side guide portions 311a, 311b and 311c can be readily set. Accordingly, in the movable range of the movable portion 120, the pressing center F is positioned within a triangle T-1 formed by connecting the centers of three rolling members 108a, 108b and 108c, thereby to obtain stable support. Further, the movable side guide portion 311a is preferably positioned in such a manner that the pressing center F (pressing point of pressing portion) crosses an axial line d, namely, in such a manner that the axial line d in the longitudinal direction of the movable side guide portion 311a is orthogonal to the pressing direction of the pressing portion, so that more stable support can be achieved.

As described above, without lowering a power output, driving efficiency and driving amount, a compact linear vibration wave motor with no need to enlarge a projected area viewed from the pressing direction of the driven member can be obtained according to the embodiment.

Embodiment 5

Figure 9:
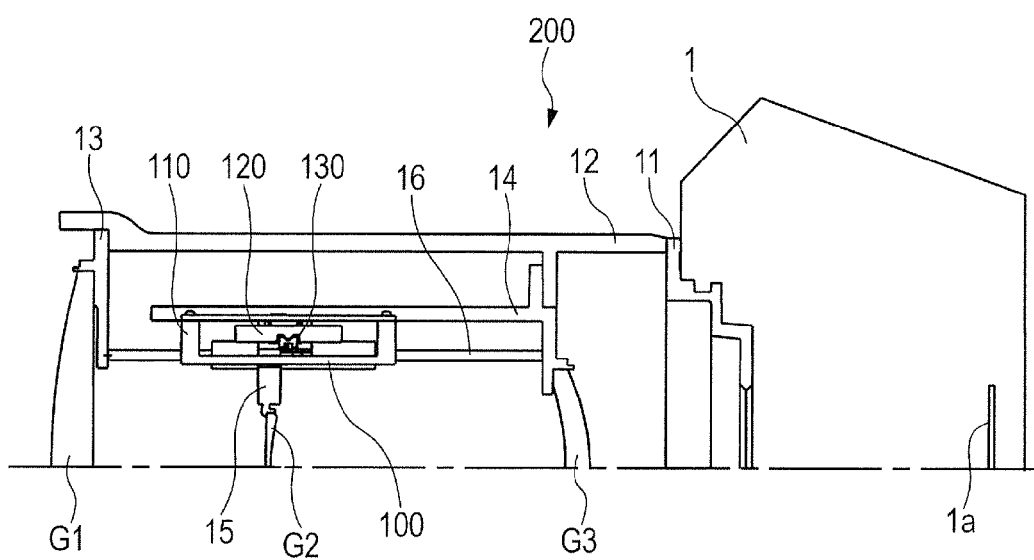
FIG. 9 is a cross sectional view illustrating a lens barrel equipped with a linear vibration wave motor according to the invention.

FIG. 9 illustrates a lens barrel as an example of lens apparatus into which a linear vibration wave motor 100 that is the above-mentioned driving apparatus of the invention as a unit is incorporated.

It is noted that only an upper half of the lens barrel is illustrated since the lens barrel is of rotationally symmetrical shape.

The lens barrel 200 is removably mounted on a camera main body 1 as an imaging apparatus and an imaging element 1a is provided in the camera main body 1.

A mount 11 of camera main body 1 is provided with a bayonet portion as a mount portion for mounting the lens barrel 200 on the camera main body 1. The lens barrel 200 is provided with a fixed barrel 12, which is abutted to a flange portion of the mount 11. Then, the fixed barrel 12 and the mount 11 are fixed on a screw (not illustrated). Further, a front barrel 13 for holding a lens G1 and a rear barrel 14 for holding a lens G3 are fixed on the fixed barrel 12.

Furthermore, the lens barrel 200 is provided with a focus lens holding frame 5 (drive object member) connected with the movable portion 120 of linear vibration wave motor 100, and the focus lens holding frame holds the focus lens G2. The focus lens holding frame 15 is, moreover, held by a publicly known guide bar 16 held by the front barrel 13 and the rear barrel 14 so as to be movable linearly.

A flange portion (not illustrated) is formed on the bottom plate 110 of the linear vibration wave motor 100 to be fixed on the rear barrel 14 by a screw or the like.

In the configuration as mentioned above, when the movable portion 120 of linear vibration wave motor 100 is driven, its driving force is transmitted to the focus lens holding frame 15 through the drive force transmitting portion 130. And the focus lens holding frame 15 moves linearly by the above-mentioned guide bar 16.

While examples of the linear vibration wave motor of the invention have been described in detail as above, the invention is not restricted to the above-mentioned embodiments, and the present invention may be applied to any configuration included within scope of the appended claims. Further, for example, an ultrasonic wave motor which causes ultrasonic vibration in a vibrating plate (vibrator) may be used as a vibration wave motor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-208812, filed Oct. 10, 2014 and Japanese Patent Application No. 2015-079809, filed Apr. 9, 2015 which are hereby incorporated by reference herein in their entirety.

What is claimed is:

1. A driving apparatus comprising:
   a movable portion having a plurality of movable side guide portions;
   a base portion having a plurality of fixed side guide portions opposed to said plurality of movable side guide portions;
   a vibrator having a piezoelectric element, the vibrator being provided at either one of said movable portion and said base portion;
   a friction member provided at the other of said movable portion and said base portion;
   a pressing portion, provided at said one of said movable portion and said base portion, for applying a pressing force to said vibrator to bring the vibrator into pressed contact with said friction member; and
   a plurality of rolling portions sandwiched between said plurality of movable side guide portions and said plurality of fixed side guide portions,
   wherein said plurality of movable side guide portions and said plurality of fixed side guide portions extend with a predetermined length in a moving direction in which said movable portion is moved with respect to said base portion through said plurality of rolling portions by vibration excited by said piezoelectric element, and
   wherein, within spacing in a direction orthogonal to said moving direction of a pair of movable side guide portions of said plurality of movable side guide portions, a pressing center of said pressing portion and another movable side guide portion of said plurality of movable side guide portions are positioned.

2. A driving apparatus according to claim 1, wherein said vibrator has two contact portions positioned within said spacing of said pair of movable side guide portions.

3. A driving apparatus according to claim 1,
   wherein said plurality of movable side guide portions are constituted by three movable side guide portions,
   wherein said plurality of fixed side guide portions are constituted by three fixed side guide portions, and
   wherein said plurality of rolling portions are constituted by three spherical rolling members.

4. A driving apparatus according to claim 3, wherein said pressing center of said pressing portion is positioned within a triangle connecting said three rolling members, said three rolling members being sandwiched by said three movable side guide portions and said three fixed side guide portions, respectively.

5. A driving apparatus according to claim 1, wherein said another movable side guide portion is arranged in such a manner that an axial line of said another movable side guide portion in a longitudinal direction is orthogonal to a pressing direction of said pressing portion.

6. A driving apparatus according to claim 2, wherein a line connecting centers of said two contact portions of said vibrator is aligned with an axial line of said another movable side guide portion in a longitudinal direction.

7. A driving apparatus according to claim 2, wherein an axial line of said another movable side guide portion in a longitudinal direction is positioned within said spacing in a direction orthogonal to said moving direction of said two contact portions of said vibrator.

8. A driving apparatus according to claim 1, wherein said movable portion is provided with a pressing mechanism retaining member having said plurality of movable side guide portions and holding said vibrator and said pressing portion, and
   wherein said base portion is provided with said friction member and a fixed portion having said plurality of fixed side guide portions.

9. A driving apparatus according to claim 1, wherein movable portion is provided with said friction member having said plurality of movable side guide portions, and
   wherein said base portion is provided with a bottom plate having said plurality of fixed side guide portions and a pressing mechanism retaining member holding said pressing portion and said vibrator.

10. A driving apparatus according to claim 1, wherein pressing portion has a spring.

11. A driving apparatus according to claim 1, wherein said driving apparatus is a linear vibration wave motor.

12. A driving apparatus according to claim 11, wherein said linear vibration wave motor is an ultrasonic motor, said vibrator of which generates ultrasonic vibration.

13. A driving apparatus according to claim 1, wherein one movable side guide portion of said pair of movable side guide portions has a V-shaped groove to sandwich said rolling portions with one of said fixed side guide portions having a V-shaped groove, wherein another movable side guide portion of said pair of movable side guide portions has a V-shaped groove or a plane groove, wherein if said another movable side guide portion of said pair of movable side guide portions has said V-shaped groove, said another movable side guide portion sandwiches said rolling portions with one of said fixed side guide portions having a plane groove, and wherein if said another movable side guide portion of said pair of movable side guide portions has said plane groove, said another movable side guide portion sandwiches said rolling portions with one of said fixed side guide portions having a V-shaped groove.

14. A driving apparatus according to claim 13, wherein said movable portion has a transmission portion for transmitting drive force to a drive object member, and wherein said transmission portion is placed at a side of said one movable side guide portion of said pair of movable side guide portions with respect to said moving direction.

15. A lens apparatus comprising:
a driving apparatus, the driving apparatus comprising:
  a movable portion having a plurality of movable side guide portions;
  a base portion having a plurality of fixed side guide portions opposed to said plurality of movable side guide portions;
  a vibrator having a piezoelectric element, the vibrator being provided at either one of said movable portion and said base portion;
  a friction member provided at the other of said movable portion and said base portion;
  a pressing portion, provided at said one of said movable portion and said base portion, for applying a pressing force to said vibrator to bring the vibrator into pressed contact with said friction member; and
  a plurality of rolling portions sandwiched between said plurality of movable side guide portions and said plurality of fixed side guide portions,
  wherein said plurality of movable side guide portions and said plurality of fixed side guide portions extend with a predetermined length in a moving direction in which said movable portion is moved with respect to said base portion through said plurality of rolling portions by vibration excited by said piezoelectric element,
  wherein, within spacing in a direction orthogonal to said moving direction of a pair of movable side guide portions of said plurality of movable side guide portions, a pressing center of said pressing portion and another movable side guide portion of said plurality of movable side guide portions are positioned,
  wherein one movable side guide portion of said pair of movable side guide portions has a V-shaped groove to sandwich said rolling portion with one of said fixed side guide portions having a V-shaped groove,
  wherein another movable side guide portion of said pair of movable side guide portions has a V-shaped groove or a plane groove,
  wherein if said another movable side guide portion of said pair of movable side guide portions has said V-shaped groove, said another movable side guide portion sandwiches said rolling portion with one of said fixed side guide portions having a plane groove,
  wherein if said another movable side guide portion of said pair of movable side guide portions has said plane groove, said another movable side guide portion sandwiches said rolling portion with one of said fixed side guide portions having a V-shaped groove,
  wherein said movable portion has a transmission portion for transmitting drive force to a drive object member,
  wherein said transmission portion is placed at a side of said one movable side guide portion of said pair of movable side guide portions with respect to said moving direction;
a drive force transmitting portion to be engaged with said transmission portion;
a lens holding frame holding a lens, the lens holding frame being connected with said movable portion through said drive force transmitting portion; and
a guide bar holding said lens holding frame so that said lens holding frame is movable linearly.

16. An imaging apparatus comprises:
a lens apparatus; and
a mount portion on which said lens apparatus is removably mounted,
  said lens apparatus comprising:
    a driving apparatus, the driving apparatus comprising:
      a movable portion having a plurality of movable side guide portions;
      a base portion having a plurality of fixed side guide portions opposed to said plurality of movable side guide portions;
      a vibrator having a piezoelectric element, the vibrator being provided at either one of said movable portion and said base portion;
      a friction member provided at the other of said movable portion and said base portion;
      a pressing portion, provided at said one of said movable portion and said base portion, for applying a pressing force to said vibrator to bring the vibrator into pressed contact with said friction member; and
      a plurality of rolling portions sandwiched between said plurality of movable side guide portions and said plurality of fixed side guide portions,
      wherein said plurality of movable side guide portions and said plurality of fixed side guide portions extend with a predetermined length in a moving direction in which said movable portion is moved with respect to said base portion through said plurality of rolling portions by vibration excited by said piezoelectric element,
      wherein, within spacing in a direction orthogonal to said moving direction of a pair of movable side guide portions of said plurality of movable side guide portions, a pressing center of said pressing portion and another movable side guide portion of said plurality of movable side guide portions are positioned,
      wherein one movable side guide portion of said pair of movable side guide portions has a V-shaped groove to sandwich said rolling portion with one of said fixed side guide portions having a V-shaped groove,
      wherein another movable side guide portion of said pair of movable side guide portions has a V-shaped groove or a plane groove,
      wherein if said another movable side guide portion of said pair of movable side guide portions has said V-shaped groove, said another movable side guide portion sandwiches said rolling portion with one of said fixed side guide portions having a plane groove, wherein if said another movable side guide portion of said pair of movable side guide portions has said plane groove, said another movable side guide portion sandwiches said rolling portion with one of said fixed side guide portions having a V-shaped groove,
wherein said movable portion has a transmission portion for transmitting drive force to a drive object member, and
wherein said transmission portion is placed at a side of said one movable side guide portion of said pair of movable side guide portions with respect to said moving direction;
a drive force transmitting portion to be engaged with said transmission portion;
a lens holding frame holding a lens, the lens holding frame being connected with said movable portion through said drive force transmitting portion; and
a guide bar holding said lens holding frame so that said lens holding frame is movable linearly.

* * * * *